(12) United States Patent
Parrish et al.

(10) Patent No.: US 11,348,808 B2
(45) Date of Patent: May 31, 2022

(54) SWITCH-MODE CONVERTER MODULE

(71) Applicant: Texas Instruments Incorporated, Dallas, TX (US)

(72) Inventors: Kristen Nguyen Parrish, Dallas, TX (US); Charles Devries, Winfield, IL (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/818,849

(22) Filed: Mar. 13, 2020

(65) Prior Publication Data

US 2020/0219735 A1 Jul. 9, 2020

Related U.S. Application Data

(63) Continuation of application No. 15/855,706, filed on Dec. 27, 2017, now Pat. No. 10,593,566.

(51) Int. Cl.

| | |
|---|---|
| *H01L 21/56* | (2006.01) |
| *H01L 23/495* | (2006.01) |
| *H01L 21/48* | (2006.01) |
| *H01F 27/28* | (2006.01) |
| *H02M 3/155* | (2006.01) |
| *H02M 1/08* | (2006.01) |
| *H01F 27/24* | (2006.01) |
| *H01L 21/78* | (2006.01) |
| *H01F 27/30* | (2006.01) |

(Continued)

(52) U.S. Cl.
CPC ........... *H01L 21/565* (2013.01); *H01F 17/04* (2013.01); *H01F 27/24* (2013.01); *H01F 27/28* (2013.01); *H01F 27/2852* (2013.01); *H01F 27/306* (2013.01); *H01F 27/40* (2013.01); *H01L 21/4825* (2013.01); *H01L 21/78* (2013.01); *H01L 23/495* (2013.01); *H01L 23/49541* (2013.01); *H02M 1/08* (2013.01); *H02M 3/155* (2013.01); *H01F 27/2828* (2013.01); *H01F 2017/048* (2013.01)

(58) Field of Classification Search
CPC ...... H01F 27/28; H01F 27/324; H01F 27/306; H01F 17/04; H01F 27/2852; H01F 27/40; H01F 27/24; H01F 2017/048; H01F 27/2828; H01L 25/03; H01L 25/04; H01L 28/10; H01L 21/565; H01L 23/495; H01L 23/49541; H01L 21/4825; H01L 21/78; H01L 23/295; H01L 23/3121; H02M 3/155; H02M 1/08
See application file for complete search history.

(56) References Cited

U.S. PATENT DOCUMENTS

| | | | | | |
|---|---|---|---|---|---|
| 5,161,098 | A | * | 11/1992 | Balakrishnan | ...... H01F 17/0033 174/529 |
| 5,751,203 | A | * | 5/1998 | Tsutsumi | ................. H01F 3/14 336/192 |

(Continued)

*Primary Examiner* — Ermias T Woldegeorgis
(74) *Attorney, Agent, or Firm* — Dawn Jos; Charles A. Brill; Frank D. Cimino

(57) ABSTRACT

A method for manufacturing a switch-mode converter includes forming a plurality of windings by coiling one or more conductors. Each of the windings is secured to one of a plurality of module bases arranged in a module array. At least one side of the array is encapsulated in a magnetic mold compound.

19 Claims, 5 Drawing Sheets

(51) Int. Cl.
   *H01F 17/04*     (2006.01)
   *H01F 27/40*     (2006.01)

(56) References Cited

U.S. PATENT DOCUMENTS

| | | | |
|---|---|---|---|
| 7,994,888 B2 * | 8/2011 | Ikriannikov | H01F 27/2847 336/192 |
| 9,378,882 B2 | 6/2016 | Kummerl et al. | |
| 2006/0096088 A1 * | 5/2006 | Lotfi | H01F 41/005 29/841 |
| 2010/0271161 A1 * | 10/2010 | Yan | H01F 1/26 336/83 |

* cited by examiner

SWITCH-MODE CONVERTER MODULE

This application is a continuation of U.S. patent application Ser. No. 15/855,706, filed Dec. 27, 2017, the contents of which are herein incorporated by reference in its entirety.

BACKGROUND

A switch-mode power supply (also known as a switch-mode converter) is an electronic circuit that converts an input direct current (DC) voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

A typical switch-mode power supply includes a switch for alternately opening and closing a current path through an inductor in response to a switching signal. In operation, a DC voltage is applied across the inductor. Electrical energy is transferred to a load connected to the inductor by alternately opening and closing the switch as a function of the switching signal. The amount of electrical energy transferred to the load is a function of the duty cycle of the switch and the frequency of the switching signal. Switch-mode power supplies are widely used to power electronic devices, particularly battery-powered devices, such as portable cellular phones, laptop computers, and other electronic systems in which efficient use of power is desirable.

Switch-mode power supplies are sometimes provided in modular form, where a sealed assembly of electronic components provides the converter functionality.

SUMMARY

A switch-mode converter module and methods for manufacturing the switch-mode converter module are disclosed herein. In one example, a method for manufacturing a switch-mode converter includes forming a plurality of windings by coiling one or more conductors. Each of the windings is secured to one of a plurality of module bases arranged in a module array. At least one side of the array is encapsulated in a magnetic mold compound.

In another example, a method for manufacturing a switch-mode converter includes attaching a power supply switching component to a module substrate. A conductor is coiled to form a winding. The winding is secured to the module substrate. A core of magnetic material is inserted into the winding. The power supply switching component, the winding, and the core are encapsulated in a magnetic mold compound.

In a further example, a switch-mode power supply module includes a substrate, a winding, a power supply switching component, a magnetic core, and magnetic mold compound. The winding is attached to the substrate. The power supply switching component is attached to the substrate. The power supply switching component is configured to drive the winding. The magnetic core is disposed in the winding. The magnetic mold compound encases the winding, the magnetic core, and the power supply switching component.

BRIEF DESCRIPTION OF THE DRAWINGS

For a detailed description of various examples, reference will now be made to the accompanying drawings in which.

DETAILED DESCRIPTION

Figure 1:
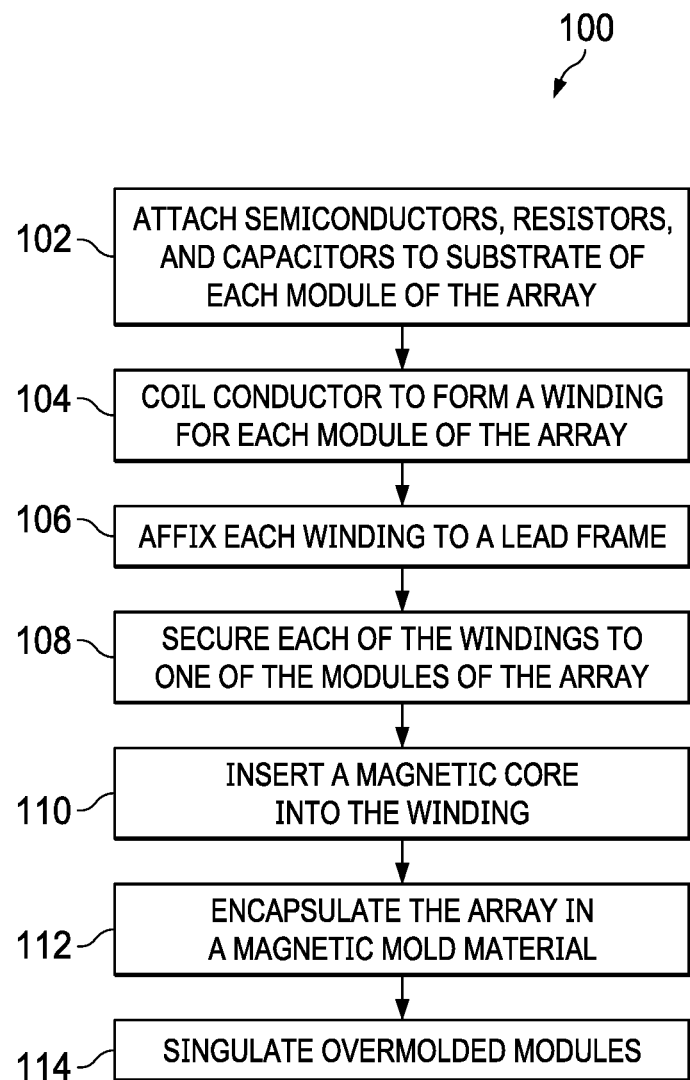
FIG. 1 shows a flow diagram for a method for manufacturing a switch-mode converter module in accordance with various examples.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Like many electronic systems, it is desirable to improve switch-mode converters by reducing the cost and size of the converter module while improving or at least maintaining converter performance. The magnetic components (e.g., inductors) used in a switch-mode converter tend to limit reductions in module size and cost, as the magnetic components are often the largest and most expensive of the electronic components used to implement the converter. Switch-mode converter modules may be encapsulated in a molding compound, with a minimum spacing between components of the module and the exterior surface of the encapsulation dictated by the requirements of the tooling applied to encapsulate the switch-mode converter. Accordingly, to achieve a desired module size, the physical size of the inductor must be limited, and conversely, the physical size of the inductor may dictate the size of the module. For example, in some switch-mode converter modules, the size of the inductor may be limited to no more than 60% of the total module size, which either limits converter performance or requires an increase in module size to improve inductor performance.

The present disclosure includes a method for manufacturing a switch-mode converter module that allows the inductor to occupy a greater percentage of the total module volume while also reducing the cost to manufacture the switch-mode converter module. In the manufacturing methods disclosed herein, switch-mode converter modules are manufactured in an array that includes a number of switch-mode converter modules. Each switch-mode converter module of an array includes a substrate on which electronic components are mounted. Semiconductors and passive components (other than magnetics) are first affixed to the substrate, and thereafter a winding is disposed atop the previously mounted components and affixed to the substrate. The entire array of electronic components, including the winding and semiconductors are encapsulated in a magnetic mold material after attachment to the substrate. After encapsulation, the switch-mode converter modules are singulated. Implementations of the present disclosure allow for an increase in the size of the inductor relative to the module as a whole by encapsulating the entirety of the module in magnetic mold material, rather than encapsulating the winding in magnetic material and encasing the module overall in a different material. Module manufacturing cost is reduced by reduction in inductor cost and production of modules in an array.

FIG. 1 shows a flow diagram for method 100 for manufacturing a switch-mode converter module in accordance with various examples. Though depicted sequentially as a matter of convenience, at least some of the actions shown can be performed in a different order and/or performed in parallel. Additionally, some implementations may perform only some of the actions shown.

In block 102, an array of switch-mode converter modules is being manufactured. A plurality of module substrates (also referred to as module bases) are arranged in an array. The array may be one-dimensional or two-dimensional. For example, a plurality of module substrates may be formed on a sheet of substrate material such as printed circuit board material. In some implementations, a module substrate may include a lead frame, laminate material, ceramic material, or other metal/dielectric arrangement that provides conductive connections for electronic components of the switch-mode converter and terminals for connection of the switch-mode converter module to an external device or circuit.

Semiconductors, resistors, and/or capacitors of the switch-mode converter are attached to the substrate of each switch-mode converter module being manufactured. For example, if an 8×8 array of switch-mode converter modules is being manufactured, then one or more power supply switching components (e.g., power supply controller integrated circuits, or switching transistors) and associated resistors, capacitors, etc. may be attached to each of the 64 module substrates of the 8×8 array. The components may be affixed to the substrate by solder paste, conductive adhesive, or other adhesive substance suitable for attaching electronic components to a substrate.

Figure 2:
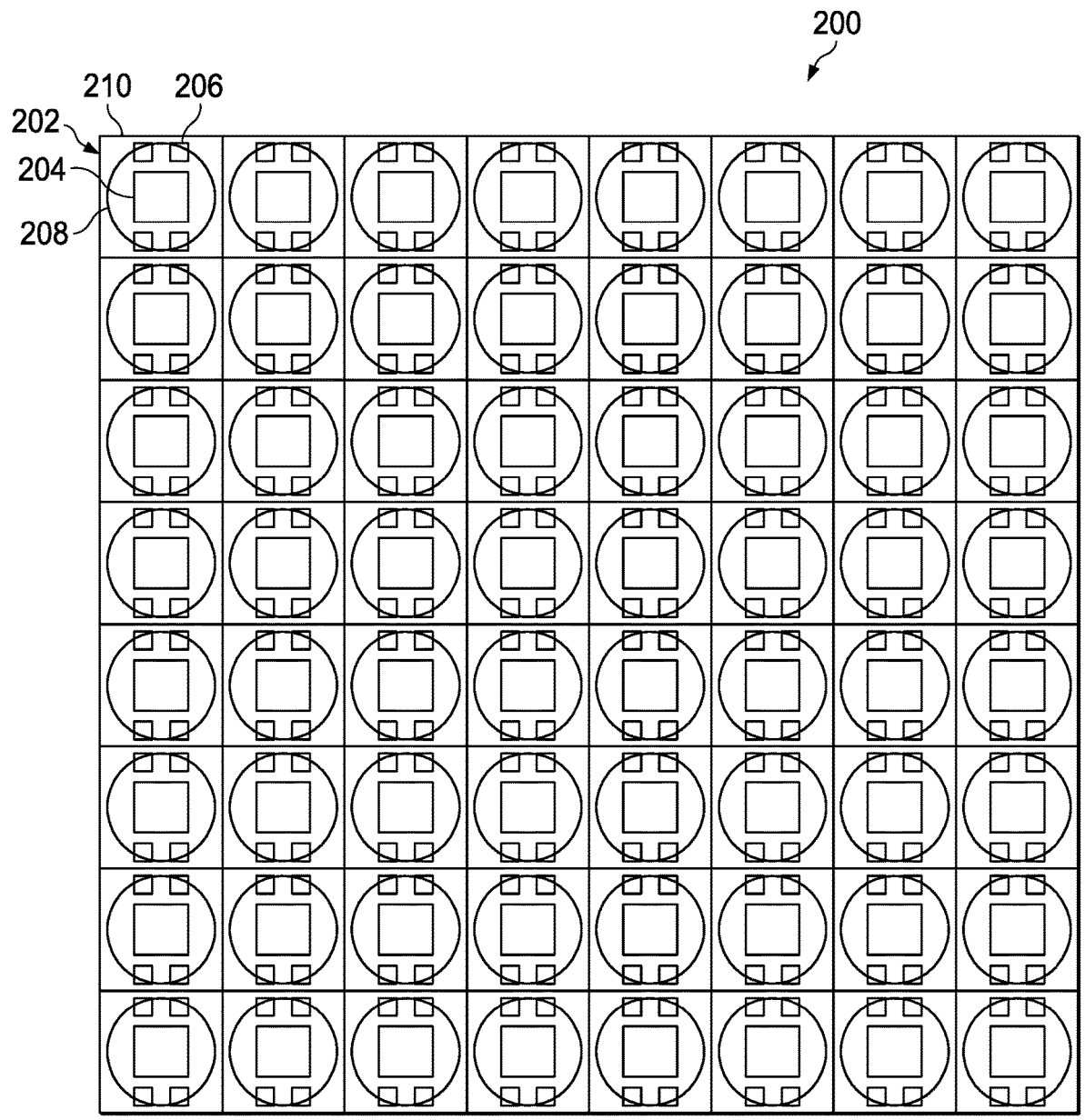
FIG. 2 shows an array of switch-mode converter modules in accordance with various examples.

FIG. 2 shows an array 200 of switch-mode converter modules in accordance with various examples. In FIG. 2, the module array 200 includes 64 switch-mode converter modules 202. Other implementations of the module array 200 may include a different number of switch-mode converter modules 202. Each switch-mode converter module 202 includes a module substrate 210, one or more power supply switching components (e.g., a power supply controller 204 and/or discrete transistors) and various other electronic components 206 (e.g., resistors, capacitors, etc.) that are attached to the module substrate 210 in block 102. The power supply controller 204 and/or other electronic components 206 may be provided in any surface mount packaging technology, and include terminals (e.g., bumps, posts, pins, etc.) that are soldered to the module substrate 210.

In block 104, a winding corresponding to each of the switch-mode converter modules 202 is formed by coiling a conductor. The conductor may be an insulated round wire, an insulated rectangular wire, etc. For example, the conductor may be an insulated copper wire (e.g., enamel/polyimide/plastic coated copper). In various implementations, the winding may form an outer-outer coil, a round wire wound coil, a flat wire wound coil, a staple winding, or other type of winding.

Figure 4:
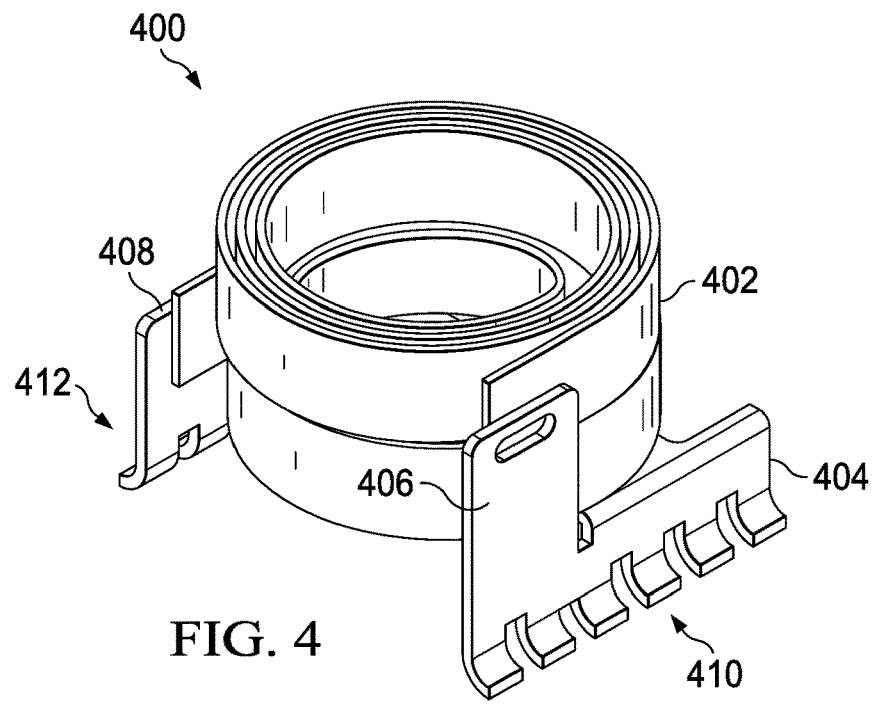
FIG. 4 shows a winding secured to a winding lead frame in accordance with various examples.

In block 106, each of the windings formed in block 104 is attached to a winding lead frame. FIG. 4 shows a winding secured to a winding lead frame in accordance with various examples. In FIG. 4, the winding 402 is secured to the winding lead frame 404. The winding 402 includes a rectangular (flat) insulated conductor coiled in an outer-outer configuration. A flat conductor is a conductor that has a width to length ratio greater than 1, and may be produced by flattening a round conductor. For example, a flat conductor may have a height that is two or more times greater than the thickness of the conductor. The winding lead frame 404 includes terminals 406 and 408 for conductively connecting the winding 402 to the winding lead frame 404. In some implementations, a first end of the winding 402 is welded or soldered to the terminal 408 and a second end of the winding 402 is welded or soldered to the terminal 406. The winding lead frame 404 also includes terminals 410 and 412 for conductively connecting the winding 402 to the module substrate 210.

Figure 4A:
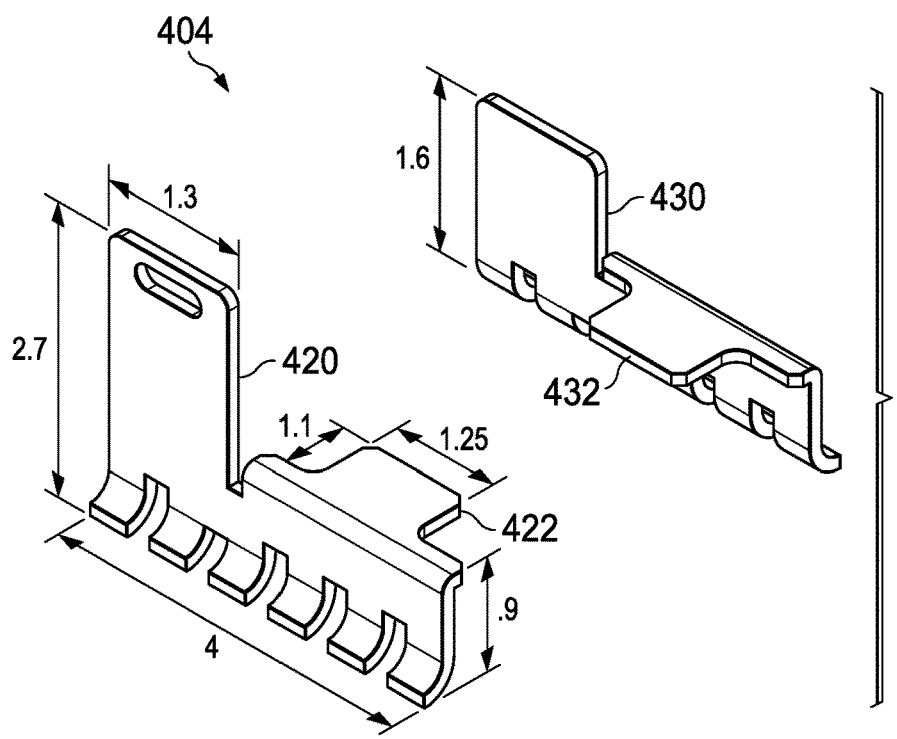
FIG. 4A shows a winding lead frame in accordance with various examples.

FIG. 4A shows an example of winding lead frame 404. The winding lead frame 404 includes a first section 420 and a second section 430. The first section 420 and the second section 430 are similar in construction, with the exception that the terminal 406 is of greater height than the terminal 408. Various dimensions of the winding lead frame 404 are shown with respect to the first section 420. All dimensions are in millimeters (mm). Illustrated dimensions (except the height of the terminal 406) are applicable to corresponding features of the second section 430. The winding lead frame 404 may for formed of copper (e.g., about 0.127 mm thick copper). The first section includes a projection 422 that extends generally normally relative to the terminal 406. The second section 430 includes a projection 432 that extends generally normally relative to the terminal 408. The winding 402 rests on and is supported by the projections 422 and 432. Other implementations of the winding lead frame 404 may have different dimensions than those shown in FIG. 4A.

In block 108, a winding 208 is secured to each of the module substrates 210. In some implementations, the winding 208 is secured to the module substrate 210 by attaching a winding lead frame to which the winding is secured to the module substrate 210. For example, the winding lead frame 404, to which the winding 402 is mounted, may be attached to the module substrate 210. The winding 402 is an implementations of the winding 208. In some implementations, the winding 208 is not attached to a lead frame, and the winding 208 is secured to the module substrate 210 without a winding lead frame. The winding 208 may be secured and conductively coupled to the module substrate 210 by solder paste, conductive adhesive, or other adhesive substance suitable for attaching the winding 208 to the module substrate 210. Securing the winding 208 to the module substrate 210 couples the winding 208 to the power supply controller 204 (or other power supply switching component), so that, in operation, the power supply controller 204 can control the flow of current in the winding 208, e.g., the power supply controller 204 may drive the winding 208.

Figure 3:
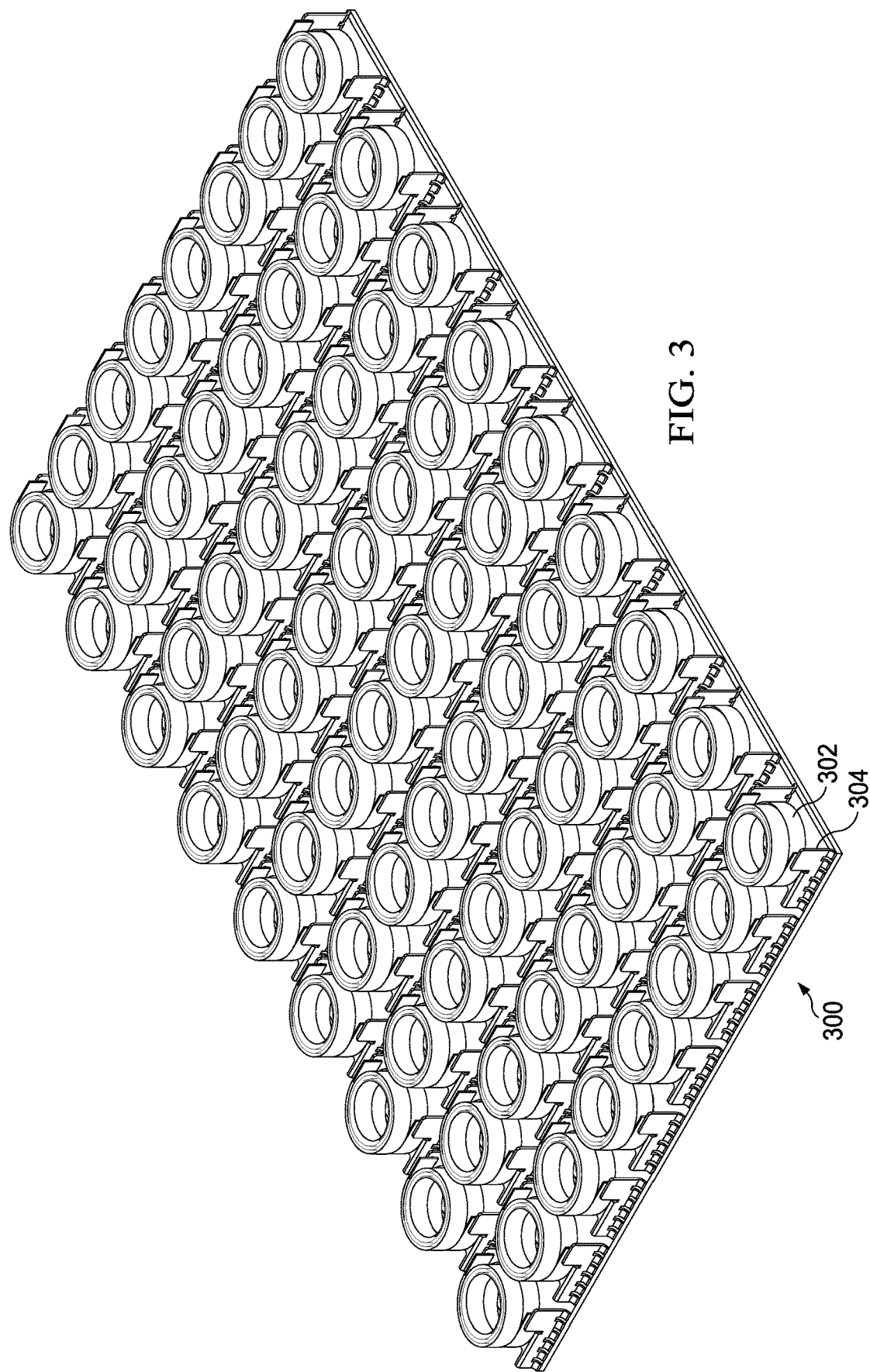
FIG. 3 shows an array of windings for attachment to a module substrate array in accordance with various examples.

In some implementations, windings may be simultaneously secured to multiple instances of the module substrate 210. For example, FIG. 3 shows an array 300 of windings for attachment to a module substrate array in accordance with various examples. The array 300 includes a two-dimensional array of winding lead frames 304, and a winding 302 mounted to each winding lead frame 304. The array 300 may be secured to the module array 200 to secure a winding 302 to each of the module substrates 210. The winding 302 is an implementations of the winding 208. The array 300 may be manufactured by conductively connecting a winding 302 to each winding lead frame 304 of the array 300.

In block 110, a magnetic core may be inserted into each of the windings. The magnetic core is formed of a material with high magnetic permeability that confines the magnetic field produced by current flow in the winding 208. Examples of such materials include ferrite ceramics, iron, amorphous steel or other metals. Some implementations of the switch mode converter module 202 may not include a magnetic core. In some implementations, a magnetic core may be inserted in the winding 208 before or after the winding 208 is secured to the module substrate 210.

In block 112, the module array 200, or at least one side thereof, is encapsulated in a magnetic mold material. For example, the mold compound applied to encapsulate the module array 200 may include a polymer, monomer, or other material and may be made by pelletizing fine powder of a mixture of resin, filler, hardener, catalyst, carbon black, and other materials. The mold compound also includes a ferromagnetic material, in the form of particles that are dispersed throughout the mold compound, that enhances the operation of (e.g., increases the inductance of) the winding 208.

The ferromagnetic material may be sendust, which is approximately 85% iron, 9% silicon and 6% aluminum and has a relative permeability of up to 140,000. The above-described materials are mixed together and then formed into a powder. In some implementations, permalloy may be used as the ferromagnetic material. Permalloys may have different concentrations of nickel and iron. In one implementation, the permalloy consists of approximately 20% nickel and 80% iron. Variations of permalloy may change the ratios of nickel and iron to 45% nickel and 55% iron. Other ferromagnetic materials include molybdenum permalloy which is an alloy of approximately 81% nickel, 17% iron and 2% molybdenum. Copper may be added to molybdenum permalloy to produce supermalloy which has approximately 77% nickel, 14% iron, 5% copper, and 4% molybdenum. The use of fine particles of sendust or other ferromagnetic powder materials enables the ferromagnetic materials to flow with the molten mold compound around electronic components that are encapsulated during the molding process.

The magnetic mold compound is in a powdered or solid form and is placed in a pot where heat and pressure are applied. The heat and pressure cause the mold compound to transition to a fluid state. In the fluid state, the mold compound may be injected into a cavity to encapsulate the module array 200 or a portion thereof. The mold compound solidifies to form a hard casing. In addition to enhancing the operation of the winding 208, the magnetic mold compound provides shielding from electromagnetic interference, and protects the electronic components of the switch-mode converter module 202 from the environment.

In block 114, the individual switch-mode converter modules 202 are singulated from the module array 200. The singulation may include sawing the encapsulated module array 200 along row and column boundaries that separate the individual switch-mode converter modules 202. In some examples, the singulation may include cutting through the mold compound to separate one switch-mode converter module 202 from another. In other examples, the singulation may include cutting through the module substrate (e.g., a module lead frame) and not cutting through the mold compound to separate one switch-mode converter module 202 from another.

Figure 5:
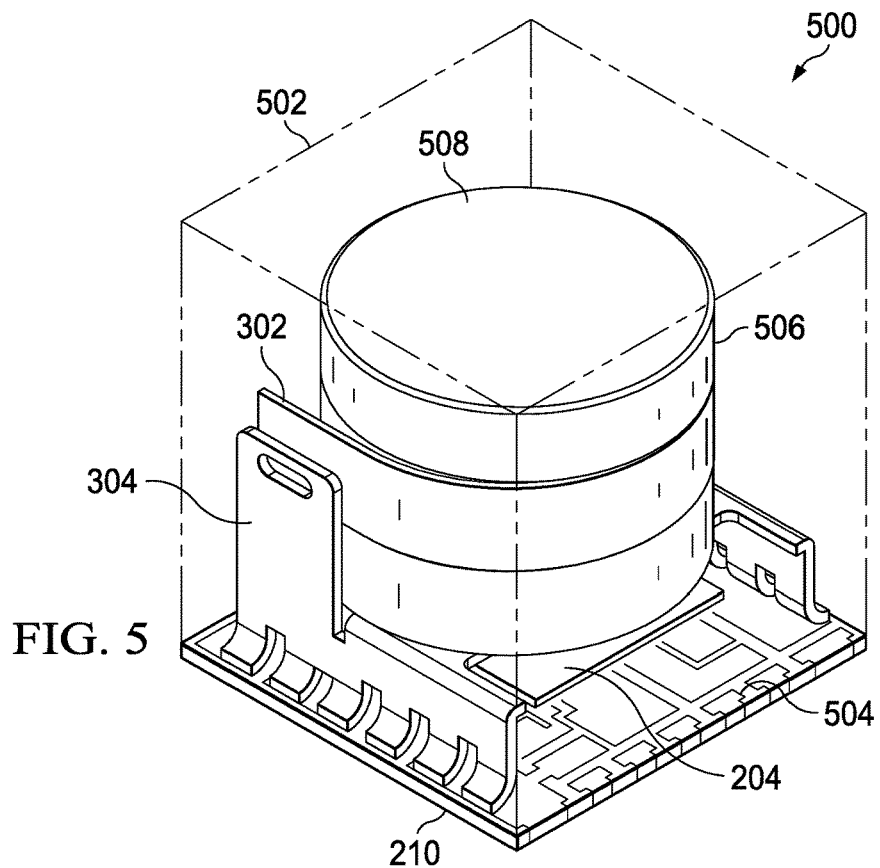
FIG. 5 shows a perspective view of an encapsulated switch-mode converter module in accordance with various examples.

FIG. 5 shows a perspective view of an encapsulated switch-mode converter module 500 after singulation of the switch-mode converter module 500 from an encapsulated module array 200. The switch-mode converter module 500 is an implementation of the switch-mode converter module 202. In the switch-mode converter module 500, the magnetic molding material 502 fully encases the electronic components of the switch-mode converter module 500. For example, the magnetic molding compound 502 fills a volume that extends from a surface 504 of the module substrate 210 to beyond a surface 508 of the magnetic core 506. In some implementations, the switch-mode converter module 500 may be about 4.5 mm in length, 4.5 mm in width, and 3.5 mm in height. In some implementations, the switch-mode converter module 500 may have different dimensions. The winding 302 may be about 2.2 mm in height and 4.2 mm in diameter. In some implementations, the winding 302 may have different dimensions.

The module substrate 210 may be a multi-layer laminate that includes in one or more layers of conductive traces (e.g., copper traces) separated by an insulator (e.g., an insulating film or resin). For example, the module substrate 210 may be constructed using printed circuit board technology.

Figure 6:
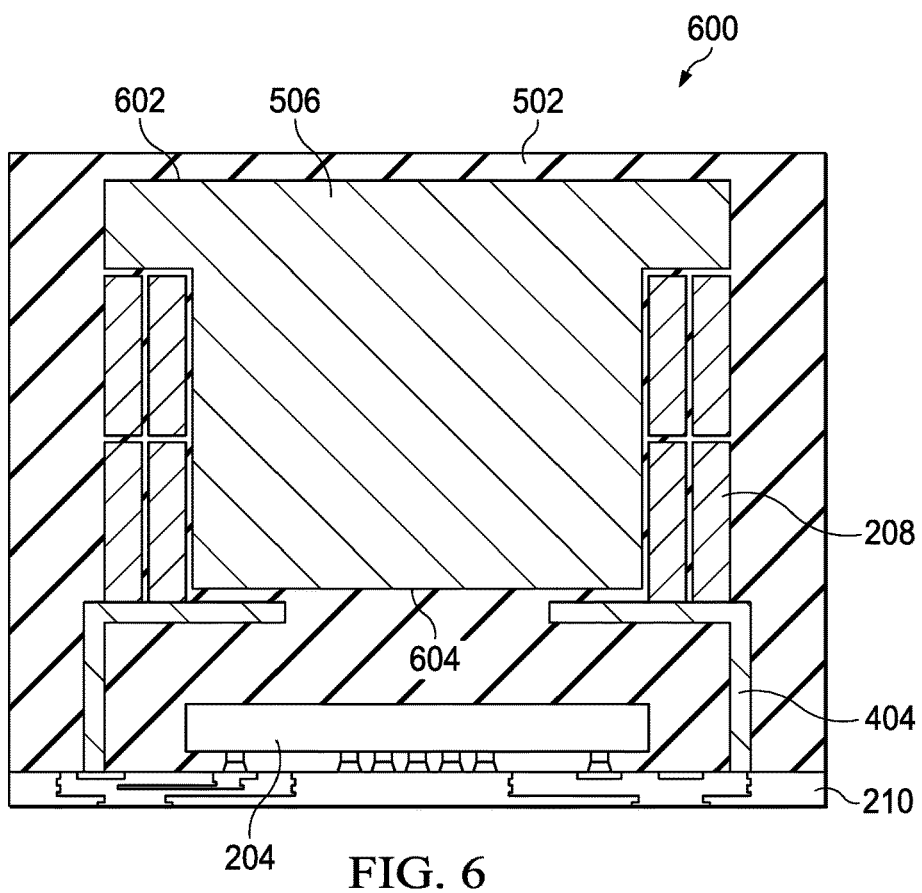
FIG. 6 shows a front cross-sectional view of an encapsulated switch-mode converter module in accordance with various examples.

FIG. 6 shows a front cross-sectional view of an encapsulated switch-mode converter module 600 in accordance with various examples. The switch-mode converter module 600 is an implementation of the switch-mode converter modules 202. In the switch-mode converter module 600, the power supply controller 204 is conductively coupled and attached to the module substrate 210. The winding 208 is disposed above the power supply controller 204. That is, the power supply controller 204 is disposed between the module substrate 210 and the winding 208. The magnetic core 508 is disposed within the winding 208. In some implementations of the magnetic core 508, a diameter of a first end 602 of the magnetic core 508 is greater than a diameter of a second end 604 of the magnetic core 508, where, for example, the second end 604 of the magnetic core 508 is disposed within the winding 208, and the first end 602 of the magnetic core 508 is disposed outside of the winding 208. The entirety of the winding 208, the magnetic core 508 and all electronic components attached to the module substrate 210 are encapsulated in the magnetic mold material 502.

In some implementations of a switch-mode converter module, the power supply controller 204, and/or other power supply switching component, passive components, etc., may be disposed on an opposite side of the substrate 210 from the side of substrate 210 on which the winding 208 is disposed. In some implementations of a switch-mode converter module, the power supply controller 204, and/or other power supply switching component, passive components, etc., may not be disposed between the substrate 210 and the winding 208.

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. A semiconductor package, comprising:
   a first substrate;

a winding attached to the first substrate via a second substrate, a portion of the winding contacting the second substrate;

a magnetic core with a portion surrounded by the winding;

a power supply switching component directly attached to the first substrate; and mold compound encasing portions of the winding, the first substrate and the magnetic core.

2. The semiconductor package of claim 1, wherein the second substrate includes a plurality of leg portions.

3. The semiconductor package of claim 2, wherein the plurality of leg portions includes a first plurality of leg portions that are opposite to a second plurality of leg portions.

4. The semiconductor package of claim 1, wherein the mold compound is a magnetic mold compound.

5. The semiconductor package of claim 4, wherein the magnetic mold compound includes one of a polymer, monomer, resin, filler, hardener, catalyst, carbon black, and ferromagnetic material.

6. The semiconductor package of claim 1, wherein the mold compound covers portions of the power supply switching component.

7. The semiconductor package of claim 1, wherein the second substrate is a winding lead frame.

8. The semiconductor package of claim 1, wherein the winding, from a cross sectional view, includes a first portion and a second portion on one side of the magnetic core, and a third portion and a fourth portion on an opposite side of the magnetic core.

9. The semiconductor package of claim 1, wherein the power supply switching component is electrically connected to the first substrate via a plurality of bumps.

10. The semiconductor package of claim 1, wherein the first substrate is a multi-layer laminate.

11. The semiconductor package of claim 1, wherein the first substrate is a printed circuit board.

12. The semiconductor package of claim 1, wherein a portion of the winding directly contacts the second substrate.

13. A semiconductor package, comprising:

a first substrate;

a winding attached to the first substrate via a second substrate, a portion of the winding contacting the second substrate;

a magnetic core disposed in the winding; and a magnetic mold compound encasing portions of the winding, the first substrate and the magnetic core.

14. The semiconductor package of claim 13, wherein the second substrate includes a plurality of leg portions.

15. The semiconductor package of claim 14, wherein the plurality of leg portions includes a first plurality of leg portions that are opposite to a second plurality of leg portions.

16. The semiconductor package of claim 13, wherein the mold compound covers portions of the power supply switching component.

17. The semiconductor package of claim 13, wherein the second substrate is a winding lead frame.

18. The semiconductor package of claim 13, wherein the winding includes a rectangular insulated conductor that has a width to length ration greater than 1.

19. The semiconductor package of claim 13, wherein the magnetic core includes one of a ferrite ceramic, iron, amorphous steel, and a metal.

* * * * *